United States Patent [19]

Aboaf et al.

[11] 4,236,946
[45] Dec. 2, 1980

[54] AMORPHOUS MAGNETIC THIN FILMS WITH HIGHLY STABLE EASY AXIS

[75] Inventors: Joseph A. Aboaf, Peekskill; Jerome J. Cuomo, Lincolndale; Amitava Gangulee, Croton-on-Hudson; Robert J. Kobliska, Mount Kisco, all of N.Y.

[73] Assignee: International Business Machines Corporation, Armonk, N.Y.

[21] Appl. No.: 886,020

[22] Filed: Mar. 13, 1978

[51] Int. Cl.³ .............................................. C21D 1/04
[52] U.S. Cl. .................................. 148/108; 148/122; 148/31.55; 75/123 B; 75/123 L; 75/123 K; 75/134 P
[58] Field of Search ............... 148/31.55, 108, 121, 148/122; 75/123 B, 123 H, 123 J, 123 K, 123 L, 123 M, 124, 125, 126 R, 126 C, 126 D, 126 E, 126 F, 126 G, 126 H, 126 P, 126 Q, 128 R, 128 B, 128 C, 128 F, 128 G, 128 Z, 128 T, 128 W, 128 V, 134 N, 134 C, 134 F, 134 V, 134 S, 134 P; 204/142 C, 142 M

[56] References Cited

U.S. PATENT DOCUMENTS

| 3,039,891 | 1/1962 | Mitchell | 148/121 |
| 3,374,113 | 3/1968 | Chang et al. | 148/108 |
| 3,409,479 | 11/1968 | Greenberg et al. | 148/108 |
| 3,472,708 | 10/1969 | Schindler et al. | 148/31.55 |
| 3,556,876 | 1/1971 | Pfeifer et al. | 148/108 |
| 3,850,706 | 11/1974 | Street | 148/31.55 |
| 3,940,293 | 2/1976 | Polk et al. | 148/11.5 F |
| 4,002,546 | 1/1977 | Shirahata et al. | 204/192 |
| 4,003,768 | 1/1977 | Anderson et al. | 148/108 |
| 4,038,073 | 7/1977 | O'Handley et al. | 148/31.55 |
| 4,052,201 | 10/1977 | Polk et al. | 75/124 R |
| 4,067,732 | 1/1978 | Ray | 75/122 |

FOREIGN PATENT DOCUMENTS 51-73923 6/1976 Japan .

OTHER PUBLICATIONS

"The Condensed Chemical Dictionary", 8th ed., 1971, p. 78.

*Primary Examiner*—L. Dewayne Rutledge
*Assistant Examiner*—John P. Sheehan
*Attorney, Agent, or Firm*—Graham S. Jones, II

[57] ABSTRACT

A sputtered thin film of an amorphous material composed of a magnetic transition metal X and element Y plus possibly an element Z has low coercivity for domains in the plane, has a well defined and stable magnetic easy axis which is extremely stable without heating above the Curie point, with a high and flat value of permeability from low frequencies to greater than 10 megahertz. Metal X can include at least one of Fe, Ni, and Co. Element Y can include at least one of Si and B. Element Z can be included composed of Cr, for example.

45 Claims, 21 Drawing Figures

H(Oe)

H(Oe)

AMORPHOUS MAGNETIC THIN FILMS WITH HIGHLY STABLE EASY AXIS

DESCRIPTION

1. Technical Field

This invention relates to amorphous thin film magnetic materials, and pertains more particularly to such a film possessing a stable magnetic easy axis and having a high permeability.

One object of this invention is to provide amorphous magnetic thin film materials possessing a stable magnetic easy axis.

Another object of this invention is to provide a magnetic thin film material having a low coercivity field $H_c$ with spontaneous magnetization in the plane of the film.

Still another object of this invention is to secure a stable and high permeability for higher frequency values than had been possible heretofore for thin film magnetic materials in general.

2. Background Art

The magnetic properties of amorphous metallic glasses have been the subject of considerable investigation since development of such amorphous magnetic materials in ribbon form by continuous rapid quenching from the melt, H. S. Chen and D. E. Polk, *J. Non-Cryst. Solids*, 15, 174(1974); S. Kavesh and J. Bedell, U.S. Pat. No. 3,845,805 (1974). The magnetic glasses typically consist of Fe, Co, and Ni alloyed with glass formers such as B, P, C, Al or Si. These new materials offer the potential of new products based upon their hardness and strength (Chen, Davis, and Ray et al below), magnetic (Gyorgy et al below), and corrosion resistant properties (Naka et al below): H. S. Chen, *Mater. Sci. Eng.*, 25, 59(1976), and references therein; E. M. Gyorgy, H. J. Leamy, R. C. Sherwood and H. S. Chen, *AIP Conf. Proc.*, 29, 198(1975); M. Naka, K. Hashimoto and T. Masumoto, *Jpn. J. Met.*, 38, 835(1974); L. A. Davis, *Rapidly Quenched Metals*, Grant and Giessen editors, p. 369; and R. Ray, R. Hasegawa, C. P. Chou, and L. A. Davis, *Scripta Metal.*, 11, 973(1977). Some work on amorphous magnetic metallic glasses in film form has been published recently: T. Egami, *Annual Conf. on Magnetism and Magnetic Materials*, Nov. 1977, Abstract 3P-1; N. Kazama and N. Heiman, ibid., Abstract 3P-2; G. Marchal, Ph. Mangin, M. Piecuch, and Chr. Janot, ibid., Abstract 3P-3; D. W. Forester, C. Vittoria, D. C. Webb, and K. L. Davis, ibid., Abstract 5D-3; Y. Shimada and H. Kojima, *Jour. App. Phys.*, 47,9(1976). Egami has studied the properties of $Fe_{80}B_{20}$ thick films deposited by high speed sputtering on a liquid nitrogen cooled substrate. Kazama et al. have reported on the properties of sputtered FeC thin films. Marchal et al., and Shimada et al. have studied the properties of FeSi films. For example, Marchal et al used vapor quenching (evaporation onto very cold substrates) to deposit amorphous FeSi films.

Shimada studied magnetic properties of R.F. sputtered FeSi films. Coercivities were relatively high for highly magnetic alloys. The materials crystallized at relatively low temperatures. Forester et al deposits Fe-Si-B films by coevaporation to yield magnetic films identical to bulk materials, whose magnetostrictive characteristics were studied.

R. J. Kobliska and A. Gangulee, "Annealing Behavior of Amorphous Gd-Co-Mo Thin Films", 20th *Annual Conference on Magnetism and Magnetic Materials*, San Francisco, *AIP Conf. Proc.*, 24, 567 (1975) stated as follows: "Long term thermal stability is a prerequisite for bubble film materials. Some results of an investigation of the isothermal annealing behavior of [R.F. sputtered] amorphous Gd-Co-Mo thin films, in the temperature range 150°-350° C., are being reported. All functional magnetic properties were retained by these films even after annealing at 350° C. The room temperature magnetization and the stripe collapse field decreased upon annealing and then stabilized, the magnitude of the decrement depending on the annealing temperature. The activation energy associated with the annealing process is about 0.4 eV. The results are interpreted in terms of corresponding changes in the compensation temperature, and they indicate that stabilization of the magnetic properties prior to bubble device fabrication may be a desirable process step" and "Hasegawa and coworkers[1,2] have shown that it is possible to alter the magnetic properties of amorphous Gd-Co thin films by annealing them. In particular, they observed a large decrease in the anisotropy $K_u$ and small changes in the room temperature magnetization M with annealing at temperatures above 180° C."

[1] R. Hasegawa, *J. Appl. Phys.*, 45 (1974), 3109-3112
[2] R. Hasegawa, R. J. Gambino, J. J. Cuomo and J. F. Ziegler, *J. Appl. Phys.*, 45 (1974), 4036-4040.

U.S. Pat. No. 3,929,604 for "Method for Producing Magnetic Recording Medium" of Shirahata suggests sputtering alloys such as Fe-Co in argon but does not mention annealing, or amorphous materials. It does not mention Si or B. High $H_c$ material was involved.

U.S. Pat. No. 3,856,513 mentions preparation of similar materials including Co-Fe-B as a possible combination by a means such as quenching or flash evaporation. No mention of annealing or magnetic characteristics was included.

U.S. Pat. No. 2,965,525 of Burbank for "Magnetic Annealing" involves annealing of Ni-Fe-Co, FeCo, Fe, Ni, and CoNi alloys by heating above the Curie temperature, which is 700° C. for Ni-Fe-Co: 45%-30%-25%, and then cooling to room temperature at the rate of 60° C./hr. while applying a magnetic field of 1 to 100 Oersteds in a given direction. Oxygen is driven out of the film by annealing. No suggestion of amorphous films is included in the patent. Very high $H_c$ material is involved.

U.S. Pat. No. 3,160,576 of Eckert teaches heating alloys such as CoFeNi in an oxygen atmosphere at 10° C. above the Curie temperature to form a ferrite.

U.S. Pat. No. 3,856,579 of Allen et al describes sputtering one of the rare earth metals and one of the transition magnetic metals, Co, Fe, and Ni and then annealing for 2 hours at 20° C., 600° C., etc., up to 1100° C. The as-deposited material was microcrystalline. The intrinsic coercive force was zero K as deposited at 20° C., 35 K Oe for annealing at 600° C., 15 K Oe for 750° C., and 25 K Oe for 1100° C. The deposit is greater than 0.00254 cm thick.

Brunsch et al "Corrosion-Resistant Thin Films with Favorable Magnetic Properties for Storage Applications," *IBM Technical Disclosure Bulletin*, 20, 1047 (Aug. 1977) describes extremely soft amorphous Fe B films with high magnetization deposited by vapor deposition on a −200° C. substrate.

Curie point writing by heating above the Curie temperature is not pertinent, because it produces heat sufficient to transform amorphous materials to crystalline form, thereby destroying the amorphous structure of the material and increasing its coercivity.

DISCLOSURE OF INVENTION

Figure 1:
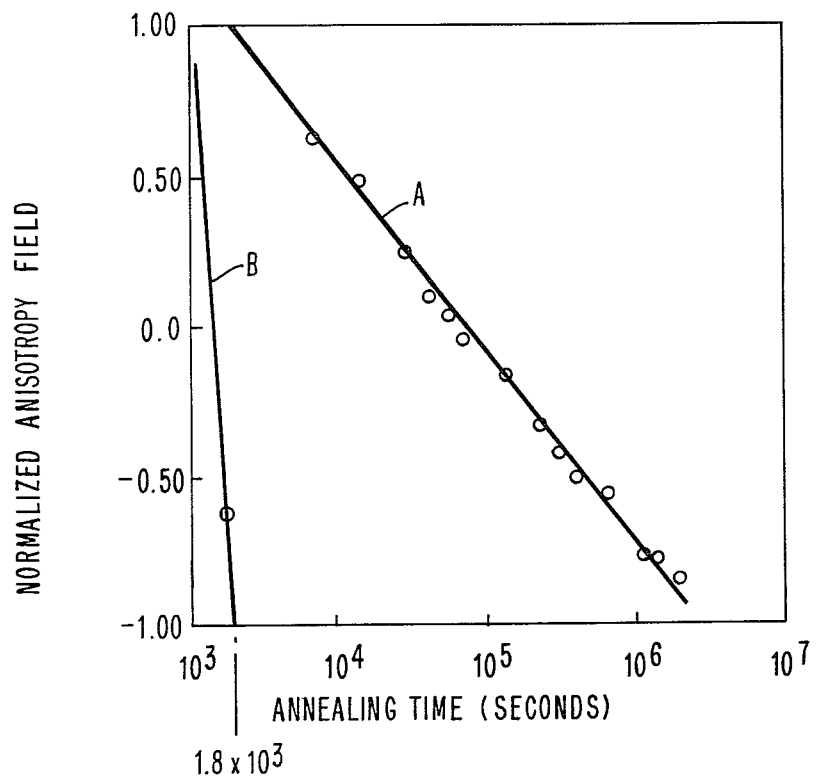
FIG. 1 shows graphs of normalized anisotropy field $H_K/H_{Ko}$ versus annealing time in seconds of amorphous films being annealed with an external field applied along the initial hard axis.

For the reader's further understanding of the invention, and its objects and advantages, reference can be made to the following description and the accompanying drawings, and to the claims which follow in which the novel features of the invention are defined.

This application pertains to the results of successful fabrication of magnetic amorphous metallic alloys deposited as thin films. The alloy compositions vary over a broader range than that obtainable for bulk samples made by rapid quenching from the melt. The magnetic properties of these amorphous alloys are comparable to those of the bulk alloys, and specific alloys exhibit technologically useful properties similar to those of thin film permalloy (80:20 Ni-Fe).

A sputtered thin film in accordance with this invention is an amorphous material composed of a magnetic transition metal X and an element Y, plus possibly an element Z, has low coercivity for domains in the plane, has a well defined and stable magnetic easy axis which is very stable without heating above the Curie point, with a high and flat value of permeability from low frequencies to greater than 10 megahertz. Metal X can include at least one of Fe, Ni, and Co. Element Y can include at least one of Si and B. Element Z can be included composed of a transition metal such as Cr, for example.

BEST MODE FOR CARRYING OUT THE INVENTION

Stability of Amorphous, Magnetic Metal Films

Magnetic amorphous metallic films exist for alloys of materials which also are crystalline depending upon (a) composition and (b) temperature. As the ratio between two elements in an alloy is varied, the stability of the amorphous material will vary and in many cases the amorphous material changes into the crystalline state. The stability of the amorphous state is enhanced by including in the alloy a higher percentage of the metalloids such as Si, B, and Al. Similarly, the higher the temperature to which one of these sputtered alloy films is raised, the greater is the tendency for the atomic structure to become crystallized. The ratio of elements in the composition of the alloy determines the critical temperature at which crystallization occurs.

The composition of matter of this invention comprises an amorphous thin film alloy of magnetic material which has been vacuum deposited preferably by sputtering. The alloy includes at least two elements, with one element comprising a transition metal including iron (Fe), nickel (Ni) and cobalt (Co). The other element is selected from the group of "glass formers" including Si and B.

If the initial thin film was magnetostrictive, it possessed a strong magnetic anisotropy $H_K^*$ perpendicular to the plane of the thin film. For example, FeB films sputtered from a $Fe_{69}B_{21}$ target have $H_c<0.20$ Oe after pre-annealing for 1 hour at 250° C., $4\pi M_s \approx 14$ KG and a very large magnetostriction and are possibly useful for magnetoacoustic devices. Such a strong magnetic characteristic is unacceptable for many purposes. For example, many devices depend upon rotation of the direction of magnetization of a thin magnetic film, e.g., thin film recording heads, and bubble device drive layers. The field necessary to rotate magnetization is proportional to $H_k$. A device with a high value of $H_k$ is less sensitive to small changes in magnetic field, so such a device would be less useful for reading magnetic recordings or would require higher drive fields in a bubble device.

Pre-annealing

In such a case of perpendicular anisotropy, the perpendicular anisotropy field $H_K^*$ of amorphous alloys can be removed by annealing for a minimum time of about an hour at a temperature of from 250°-300° C. depending upon the characteristics of the particular amorphous alloy being annealed. It should be noted that at room temperature not all amorphous alloys of the above set of materials are magnetic and those which are not magnetic do not pertain to the subject matter of this invention. Binary alloys falling into that nonmagnetic category include Ni-Si, Ni-B (which needs Co or Fe to be magnetic), and Co-Si. While Fe-Si amorphous alloys are magnetic, when subjected to low annealing temperatures they tend to become crystalline and so some but not all of the objects of this invention appear not to be achievable with binary Fe-Si amorphous alloys, for that reason, since the amorphous nature of the films is destroyed by some of the annealing treatments employed in accordance with this invention. However, if Fe-Si amorphous alloys are annealed for very long times on the order of months and years at temperatures on the order of 150° C., the material will be magnetically stabilized.

Amorphous magnetic thin films with superior properties have been fabricated by R.F. sputtering in Ar at room temperature from arc-melted or composite targets. These films have potential applications in thin film heads or magnetoacoustic devices or bubble domain devices. Typical optimized sputtering conditions were $V_{target} = 1,000$ V, $V_{bias} = 50$ V and Ar pressure of 20 μm. Films were generally 2–4,000 Angstroms thick up to 5 micro-meters in thickness.

Co-Fe-B thin films sputtered from a $Co_{78}Fe_5B_{17}$ target typically exhibit $H_c < 0.1$ Oe, $4\pi M_s \approx 15$ kG and near-zero magnetostriction, and Co-Fe-B usually has little or no perpendicular anisotropy field $H_k^*$, depending upon its composition.

Fe-B thin films sputtered from a $Fe_{69}B_{21}$ target have $H_c < 0.20$ Oe, $4\pi M_s \approx 14$ kG and a very large magnetostriction which may be useful in magnetoacoustic devices.

Other amorphous films in the systems Fe-Cr-B, Fe-Si, Fe-Si-B were also fabricated and they typically exhibited $H_c < 0.2$ Oe and $4\pi M_s$ in the range 6–12 kG.

In the as sputtered state, however, all the magnetostrictive films described above exhibit a strong perpendicular anisotropy, and are unusable as such. The magnitude of their perpendicular anisotropy depends on fabrication conditions. This perpendicular anisotropy can be eliminated by annealing for an hour in the temperature range 250°–300° C.

Easy Axis Stabilization

For some device applications, it has been highly desired to have a well-defined stable magnetic easy axis. We have discovered that certain of the above amorphous films can be driven into a "second amorphous state" so that such a stable easy axis is obtained by annealing for long periods (e.g., 16 hours for a temperature on the order of 250° C. to 1 hour or less for a temperature on the order of 350° C. in the presence of an external magnetic field.

The temperature for this stabilization anneal should be as high as possible but should be below $T_{Curie}$ and $T_{crystallization}$. Therefore, this temperature has to be optimized for each composition. Further, this stabilization anneal can be combined with the preannealing treatment for eliminating perpendicular anisotropy.

A stable easy axis can be achieved for Co-Fe-B by annealing at 250° C. for at least 16 hours and at 300° C. for 3 hours in the presence of an external magnetic field. However, at 300° C. $H_c$ begins to rise. Stabilization annealing should be performed below $T_{Curie}$ and $T_{crystallization}$ of the material. The material has a low value of $H_c$, and it has a fixed anisotropy which is not easily reversible without destroying the amorphous quality of the film by heating it to a temperature above the Curie point. The material is made unusable by heating above the Curie point because then the material is no longer magnetic. At or near the crystallization temperature crystals are formed and the domain boundaries cannot move so easily, thereby raising the value of $H_c$. The amorphous material is changed from a first amorphous state to a second amorphous state by such prolonged annealing following the removal of the perpendicular anisotropy. The temperature of crystallization is indicated by increase in $H_c$, so the annealing temperature is held below a temperature at which $H_c$ is driven above about 1 Oe, at which point $H_c$ is believed to be excessive and the material is ceasing to be amorphous.

It is believed by the inventors that this invention may be practiced with up to about 10% of a transition metallic material other than Ni, Fe, or Co included in the alloy selected from the broad class of transition metals including Cr, Mo, V, Cu, Pd, Pt, Re, Ru, Ta, Zr, Hf, Rh, Y, and Al etc., whenever the alloy achieved possesses the desired permeability and anisotropy field.

Ternary alloys containing more than one of Ni, Fe, and Co are also believed to be satisfactory to perform in accordance with this invention.

Figure 2A:
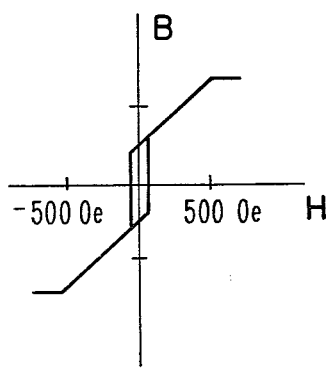
FIGS. 2A-2D show hysteresis curves for amorphous films in accordance with this invention.
Figure 2B:
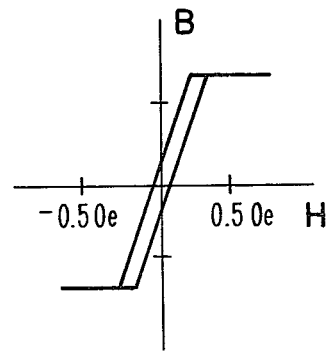

FIG. 1 shows in curves A and B how the normalized anisotropy field $H_k/H_{ko}$ in the plane of the film changes direction as a function of time in response to an external magnetic field directed at right angles to the initial easy axis (along the original hard axis). The value of curve A along the initial axis is reduced to zero after an short annealing time of about $7 \times 10^4$ seconds and then increases at right angles to the initial easy axis to produce a value of $-0.9$, as indicated after about $2 \times 10^6$ seconds. Curve B shows the result of subjecting a similar film which has not been annealed previously to the same magnetic field. Obviously, the anisotropy field reverses rapidly, where comparatively curve A appears almost "irreversible" or extremely stable, although it will reverse in such a strong magnetic field after a very long time and at a high temperature of 225° C. which is a higher temperature than would be expected to be encountered in a magnetic recording or magnetic bubble application. Iron-boron films deposited at room temperature possess perpendicular anisotropy as shown by the Magnetization (B) vs. Magnetic Field (H) (B-H) hysteresis loop for FeB in FIG. 2A. The in-plane field necessary to saturate the film in the film plane is about 500 Oe. A one-hour anneal at 250° C. is sufficient to remove this perpendicular anisotropy from the FeB film as shown in FIG. 2B. The change in scale of $10^3$ distorts the comparison so that the curve in FIG. 2B would be almost a straight vertical line at the axis if it were drawn to the same scale as in FIG. 2A. Such an annealing step is typically required to obtain low coercivity and square hysteresis loops for any of the film compositions employed in accordance with this invention.

TABLE I

Magnetic Properties and Saturation Magnetostriction For Four Amorphous Film Compositions

| Composition | $4\pi M_s$ (kG) | $H_c$ (Oe) | $H_k$ (Oe) | $\lambda_s \times 10^6$ |
|---|---|---|---|---|
| $Co_{79}Fe_5B_{14}Mo_2$ | 15 | $\leq .05$ | 15 | $\sim 0$ |
| $Fe_{73}B_{27}$ | 16 | $\leq .1$ | 5 | $+27$ |
| $Fe_{66}Cr_9B_{25}$ | 6 | $\leq .1$ | 1 | $+4$ |
| $Fe_{70}Si_{30}$ | 12 | $\leq .5$ | 3 | $+30$ |

Some properties of the alloy systems investigated are given in Table I. The listed compositions were determined by electron microprobe analysis of deposited thin films. Note that the relative accuracies are ±2% for Co, ±5% for Fe and Si but only ±10% for B. The magnetization ($4\pi M_s$), coercivity ($H_c$), and anisotropy field ($H_k$) were measured with a 60 Hz inductive hysteresigraph whereas the magnetostriction $\lambda_s \times 10^6$ were measured by the thin film capacitance technique, (E. Klokholm, *IEEE Trans. on Magnetics*, MAG-12, 819 (1976)).

Typical accuracies for the magnetic properties are ±10% while 0.05 Oe is the instrumental lower limit for the coercivity $H_c$. As for the bulk alloys, the CoFeB alloy has zero magnetostriction $\lambda_s$ and very low coercivity (R. C. O'Handley, R. Hasegawa, R. Ray, and C. P. Chou, *Appl. Phys. Lett.*, 29, 330(1976)).

Fe-B exhibits very large magnetostriction $\lambda_s$ whereas Fe-B-Cr has far lower magnetization and magnetostriction. Fe-Si glasses cannot be made in bulk by the rapid quenching techniques, but when deposited by sputtering, they exhibit low coercivity and large magnetostriction. In addition, these Fe-Si thin film alloys have been shown to be corrosion resistant (Y. Shimada and H.

Kojima, *J. Appl. Phys.*, 47, 4156 (1976); V. Brusic, R. D. MacInnes and J. Aboaf, *Fourth Int. Symp. on Passivity,* Oct. 1977, Airlie, Virginia.)

Figure 2C:
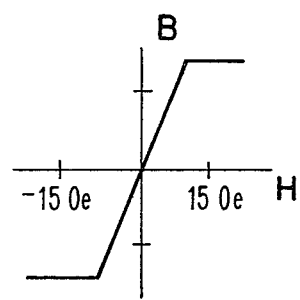
Figure 2D:
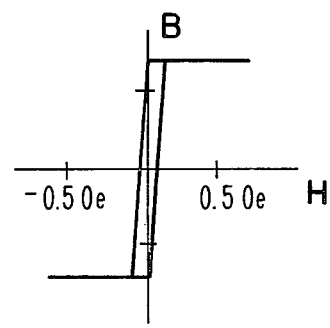

The listed values of $H_k$ in Table I are the maximum values obtained after removal of the perpendicular anisotropy $H_k^*$. Typical hard and easy axis hysteresis loops are shown in FIGS. 2C and 2D for a Co-Fe-B thin film. An interesting observation is that perpendicular anisotropy field $H_k$ is quite susceptible to rotation by field annealing. A half-hour anneal at 250° C. in an externally applied field applied at right angles to the easy axis results in a complete rotation of the magnetic easy axis. Systematic measurement of the anisotropy field $H_k$ as a function of time indicates that this easy axis rotation takes place through a decrease in the magnitude of the anisotropy field $H_k$ along the initial easy axis followed by a coupled increase in $H_k$ along the initial hard axis direction. This behavior is illustrated by curve B for an unstabilized film in FIG. 1 where the time dependence of the normalized anisotropy field $H_k/H_{ko}$ is plotted for a Co-Fe-B film for hard axis annealing at 225° C. An unstabilized film's curve B with an easily reversible anisotropy is shown which descends to an opposite value for the normalized anisotropy far more quickly than the stabilized Curve A. Here the positive and negative signs of the anisotropy field indicate that the easy axis is along the initial easy axis when it is positive and along the initial hard axis when it is negative. The straight line indicates a theoretical fit based on a model involving excess vacancies, which is analogous to the one used for crystalline materials. This model predicts that the normalized anisotropy field $H_k/H_{ko}$ is equal to the quantity $1 - a \ln(t/\tau)$, where t is time, a is a rate constant and $\tau$ is the incubation period between application of heat and commencement of rotation of the field. Details of the annealing kinetics and thermal stability will be discussed below.

These amorphous ferromagnetic thin films exhibit resistivities similar to those of the bulk alloys resulting in a good high frequency permeability due to lower eddy current losses. Typically, the permeability of these amorphous alloys decreases by only 10 to 20% between DC and 100 MHz.

Amorphous ferromagnetic thin films in accordance with this invention have properties comparable to those of the bulk rapidly quenched ribbons. Specific alloys exhibit coercivities comparable to that of thin film 80:20 Ni:Fe (permalloy) as well as better high frequency permeability characteristics. In contrast to crystalline thin films, all amorphous compositions studied exhibit low coercivities. The added flexibility gained in compositions with low coercivities permits the optimization of these alloys with respect to other relevant properties such as corrosion and wear resistance, for use in magnetic recording and data storage applications, such as magnetic read heads and magnetic bubble devices.

Figure 3A:
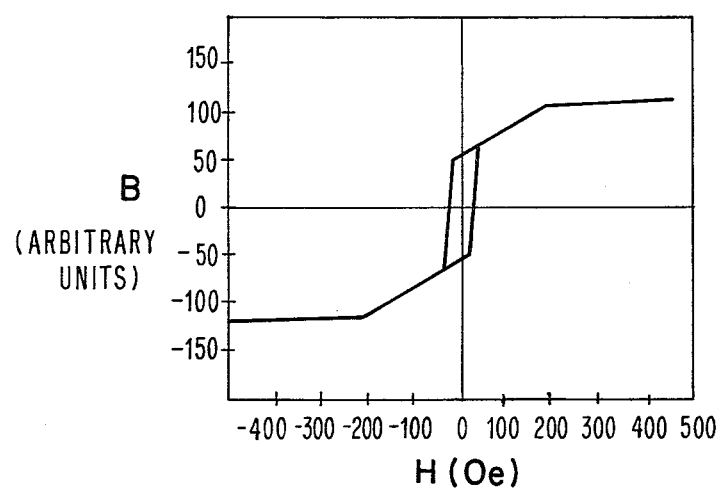
FIGS. 3A-3F show progressive hysteresis curves for an identical set of films as annealing temperatures are raised.
Figure 3B:
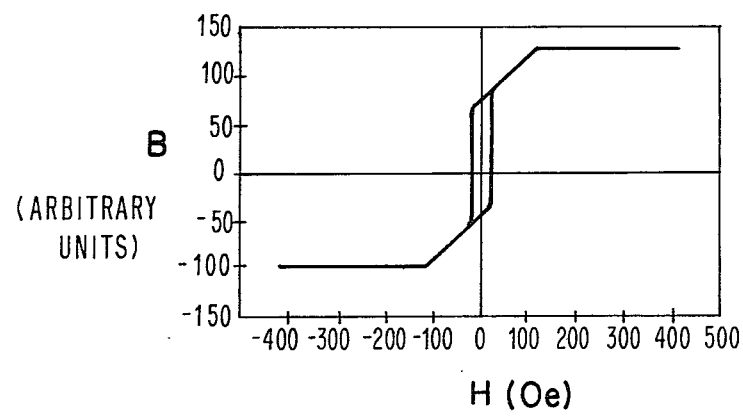
Figure 3C:
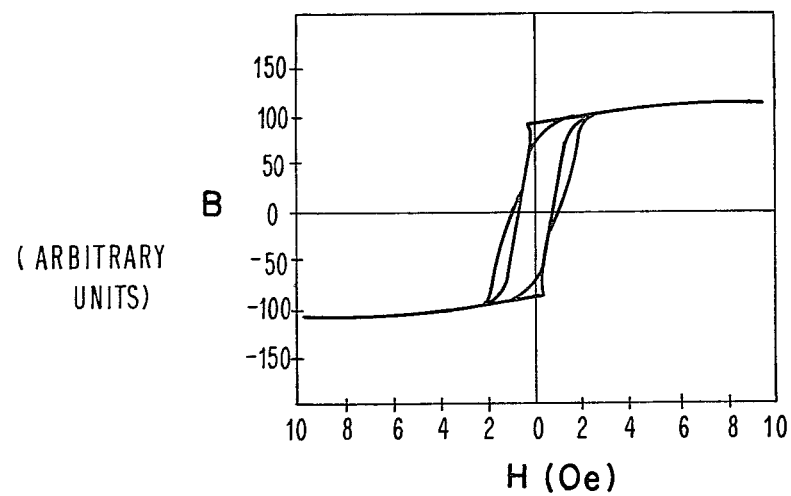
Figure 3D:
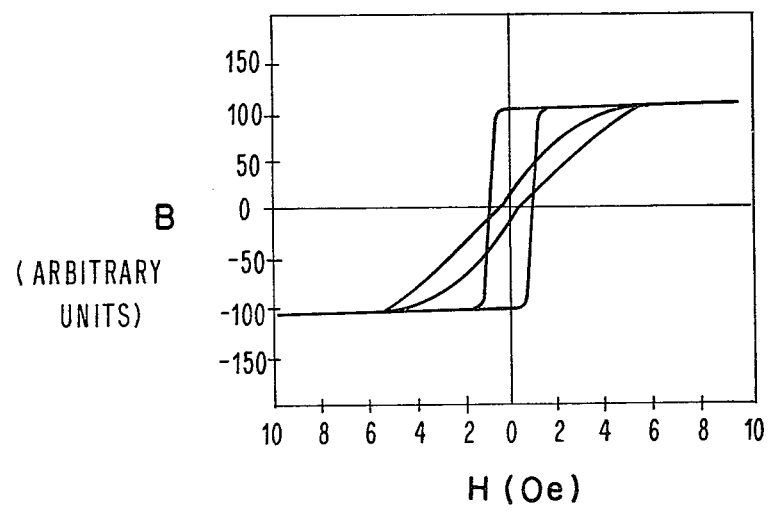
Figure 3E:
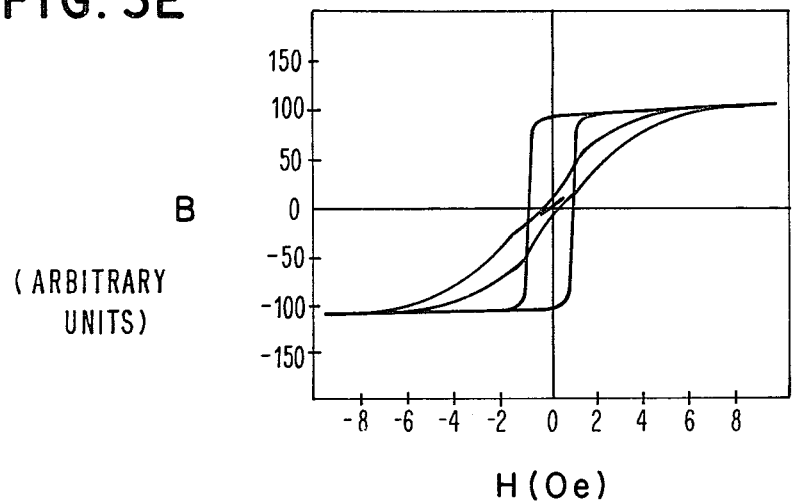
Figure 3F:
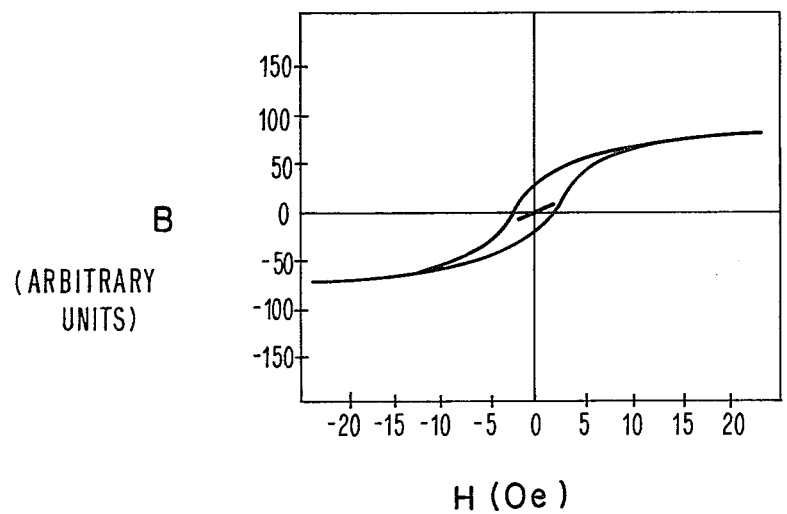

FIG. 3A shows a hysteresis loop for an iron silicon amorphous thin film as deposited with a perpendicular anisotropy field $H_k^*$ of 200 Oe. FIG. 3B shows another hysteresis curve of an identical film after annealing for thirty minutes at 150° C. with a value of $H_k^*$ reduced to 150 Oe. FIG. 3C shows the hysteresis curve of an identical film to the film of FIG. 3A after it has been annealed for thirty minutes at 200° C. with a value of $H_k^* \simeq 10$. FIG. 3D shows the result of annealing a film such as that shown in FIG. 3A for thirty minutes at 225° C. to produce a value of $H_k$ (in plane) of about 5 Oe. FIG. 3E shows curves after annealing for thirty minutes at 250° C. producing a value of $H_k \simeq 6$ Oe. In FIG. 3F, the film was annealed at 270° C. for thirty minutes, with $H_k \simeq 20$ Oe and $H_c$ increasing with no well defined easy axis and no square loop hysteresis curve. In the case of FIG. 3F, the amorphous film has begun to crystallize and the desirable easy axis characteristics of a high degree of stability of the easy axis anisotropy has been destroyed because of the crystallization.

TABLE II

| | $Co_{79.3}Fe_{5.1}Mo_{1.5}B_{14.1}$ | |
|---|---|---|
| Time | Anneal | Structure |
| 1 hr. | Annealed at 285° C. | Amorphous |
| 1 hr. | Annealed at 350° C. | " |
| 227 hrs. | Annealed at 225° C. | " |

Table II shows the result of annealing a specific Co-Fe-B alloy with an insignificant trace of Mo derived from accidental sputtering of the backing plate holding the sputtering target for varying times and temperatures. It can be seen that this alloy remained amorphous for all three experiments because the annealing temperatures were sufficiently low for the annealing times employed.

TABLE III

| | $Fe_{73.2}B_{26.8}$ | |
|---|---|---|
| Time | Anneal | Structure |
| 1 hr. | Annealed at 350° C. | Amorphous |
| 1 hr. | Annealed at 450° C. | Micro-crystalline |
| 291 hrs. | Annealed at 225° C. | Amorphous |

Iron boron was annealed in Table III in a similar way to the work of Table II but when the Fe-B alloy was annealed for only one hour at 450° C., faint lines were detected by an x-ray diffraction study which indicated that the Fe-B alloy was beginning to crystallize.

Experimental data applicants have developed show that amorphous, magnetic, thin films of Fe-B, Fe-Ni-B, and Co-Fe-B can be produced successfully by sputtering, producing materials with crystallization temperatures in excess of 300° C. We have found that no crystallization of Co-Fe-B occurs by annealing it at 225° C. for 300 hours. Pre-annealing stabilization in a magnetic field for the purpose of preventing the film from switching the direction of its easy axis easily can be done at 250°–300° C. for several hours (on the order of one to sixteen hours).

Figure 4:
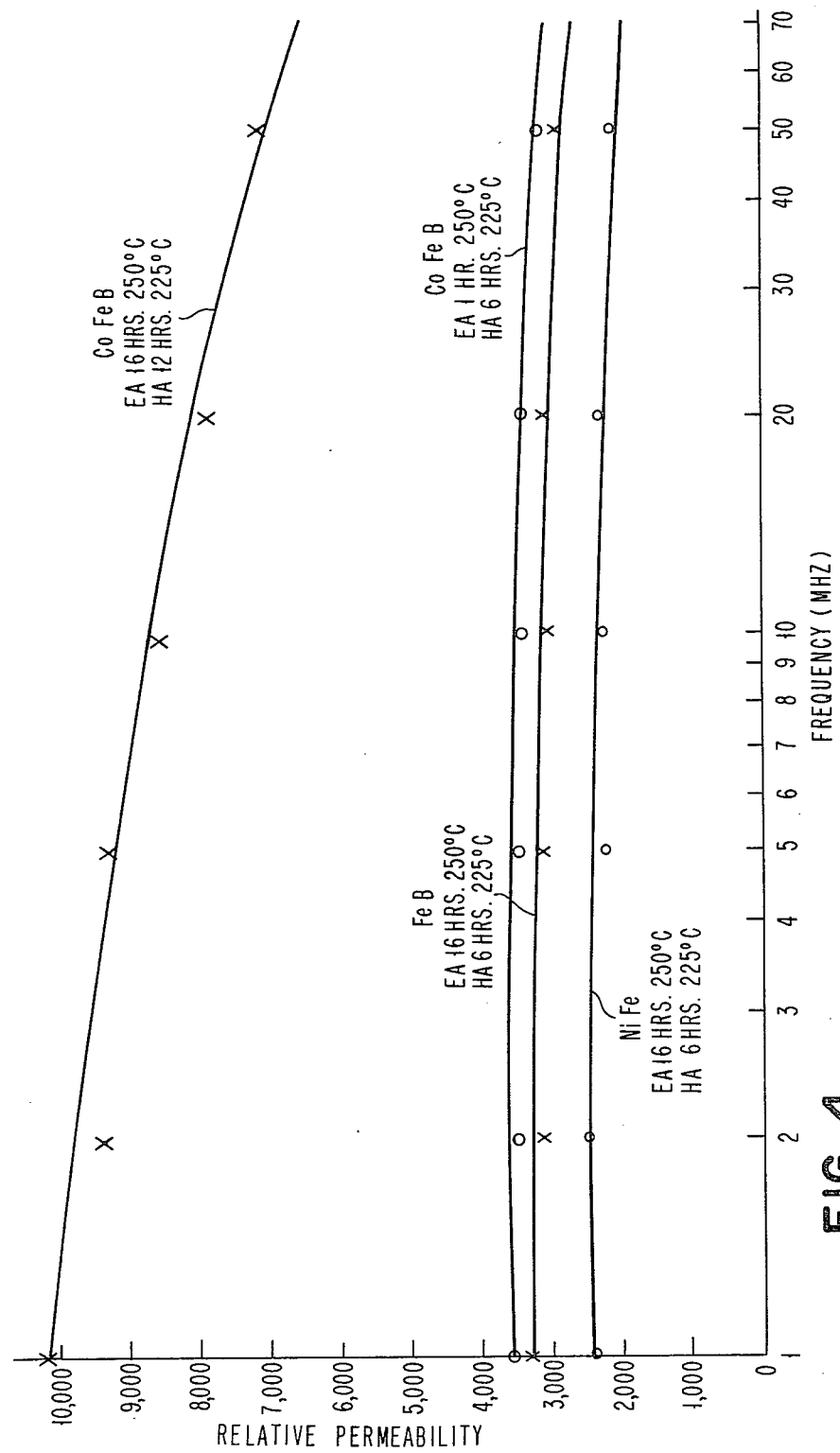
FIG. 4 shows a set of permeability versus frequency curves for several alloys.

FIG. 4 shows a linear plot of permeability versus a logarithmic plot of frequency for alloys of Co-Fe-B, Fe-B, and Ni-Fe which were annealed for various times, first with an easy axis anneal at 250° C., and later after a hard axis anneal at right angles to the first anneal at 225° C. The upper curve shows a high permeability for Co-Fe-B with a long easy axis anneal and a long hard axis anneal as compared with the lower Co-Fe-B alloy curve, which shows how much permeability is enhanced by longer annealing times.

The Fe-B alloy in the next curve had a long easy axis anneal and a shorter hard axis anneal producing a slightly lower permeability for Fe-B.

The lowest permeability was shown for an Ni-Fe alloy which was subjected to a long easy axis anneal and a short hard axis anneal. This shows the very high permeability levels of the annealed amorphous films in accordance with this invention.

TABLE IV

| Anneal | Magnetic Annealing | $H_C$ (Oe) | $H_k$ (Oe) |
|---|---|---|---|
| | $Co_{79.3}Fe_{5.1}Mo_{1.5}B_{14.1}$ | | |
| 1 hr. | 275° C. | .17 | 13 |
| 1 hr. | 300° C. | .20 | 14 |
| 1 hr. | 325° C. | 2.5 | 17.5 |
| 1 hr. | 350° C. | 1.2 | 13.5 |
| | $Fe_{73.2}B_{26.8}$ | | |
| 1 hr. | 275° C. | .05 | 6.7 |
| 1 hr. | 300° C. | .05 | 6.6 |
| 1 hr. | 325° C. | .05 | 6.2 |
| 1 hr. | 350° C. | .05 | 5.4 |

Table IV shows that as the annealing temperature of a given Co-Fe-B alloy with traces of Mo is raised from 275° C. for similar samples that the coercive field $H_c$ and the anisotropy field $H_k$ rise. Above 300° C., the value of $H_c$ exceeds a limit of one Oe which is believed to provide a useful rule of thumb as to what is an excessive coercivity for such a material. In the case of the Fe-B alloy, the coercive field $H_c$ remained constant as the anisotropy field $H_k$ declined. The alloy was stable at 350° C.

TABLE V

| | Stabilization | Sample 1 | | Sample 2 | |
|---|---|---|---|---|---|
| Anneal | | $H_c$ (Oe) | $H_k$ (Oe) | $H_C$ (Oe) | $H_k$ (Oe) |
| | $Co_{79.3}Fe_{5.1}Mo_{1.5}B_{14.1}$ | | | | |
| 1 hr | 250° C. | 0.1 | 18 | 0.05 | 14.5 |
| 16 hrs. | 250° C. | 0.1 | 18 | 0.12 | 14 |
| 1 hr. | 300° C. | 0.5 | 14.2 | 0.65 | 15 |
| | $Fe_{73.2}B_{26.8}$ | | | | |
| 16 hrs. | 250° C. | 0.4 | 8 | 0.04 | 7 |
| 1 hr. | 325° C. | 0.05 | 6.4 | 0.09 | 6.5 |

Table V shows the results of a stabilization or easy axis anneal for the above Co-Fe alloy (Mo trace) and the Fe-B alloy. In the case of Co-Fe-B, the coercive field $H_c$ and the anisotropy field $H_k$ remained about the same for two samples for annealing at 250° C. for either 1 hour or 16 hours, but the coercive field $H_c$ clearly rose for annealing at 300° C. for 1 hour while the anisotropy field $H_k$ appears to have decreased on the average.

For the Fe-B alloy, annealing for 1 hour at 325° C. produced a far lower value of $H_c$ than for 16 hours at 250° C., whereas $H_k$ declined for the shorter, higher temperature treatment. This data shows how $H_c$ and $H_k$ depend upon temperature and time.

Figure 5:
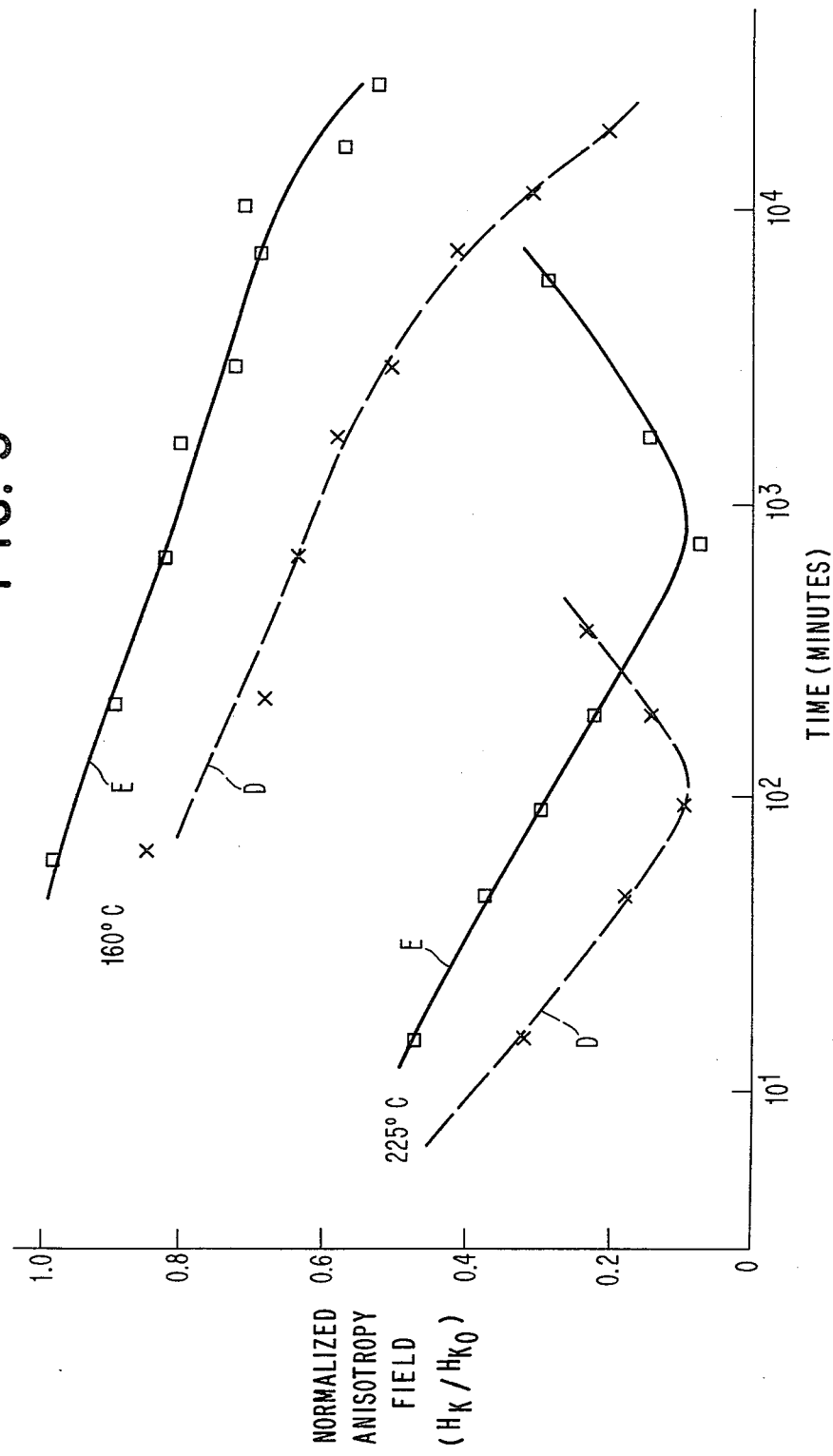
FIG. 5 shows normalized anisotropy curves versus annealing time for hard axis annealing following easy axis stabilization annealing.

FIG. 5 shows a set of curves of normalized anisotropy field $H_k/H_{ko}$ versus annealing time for $Co_{79.3}Fe_{5.1}Mo_{1.5}B_{14.1}$. Curves D refer to samples subjected to hard axis annealing which had previously received a pre-annealing stabilization for 1 hour at 250° C. and Curves E had received a pre-anneal stabilization for 16 hours at 250° C. Two sets of curves were obtained for hard axis annealing at 160° C. and 225° C. The values of $H_k/H_{ko}$ for curves E declined less in the case of the 160° C. anneal and less steeply at the end showing that the longer annealing time provided greater stabilization of the anisotropy field.

For annealing at 225° C. in a magnetic field at right angles to the easy axis the normalized anisotropy of both films declined to the same minimum normalized anisotropy. Then a new anisotropy direction developed along the original hard axis direction, but curve E required far longer to reach the minimum which indicates a far greater stability.

Figure 6:
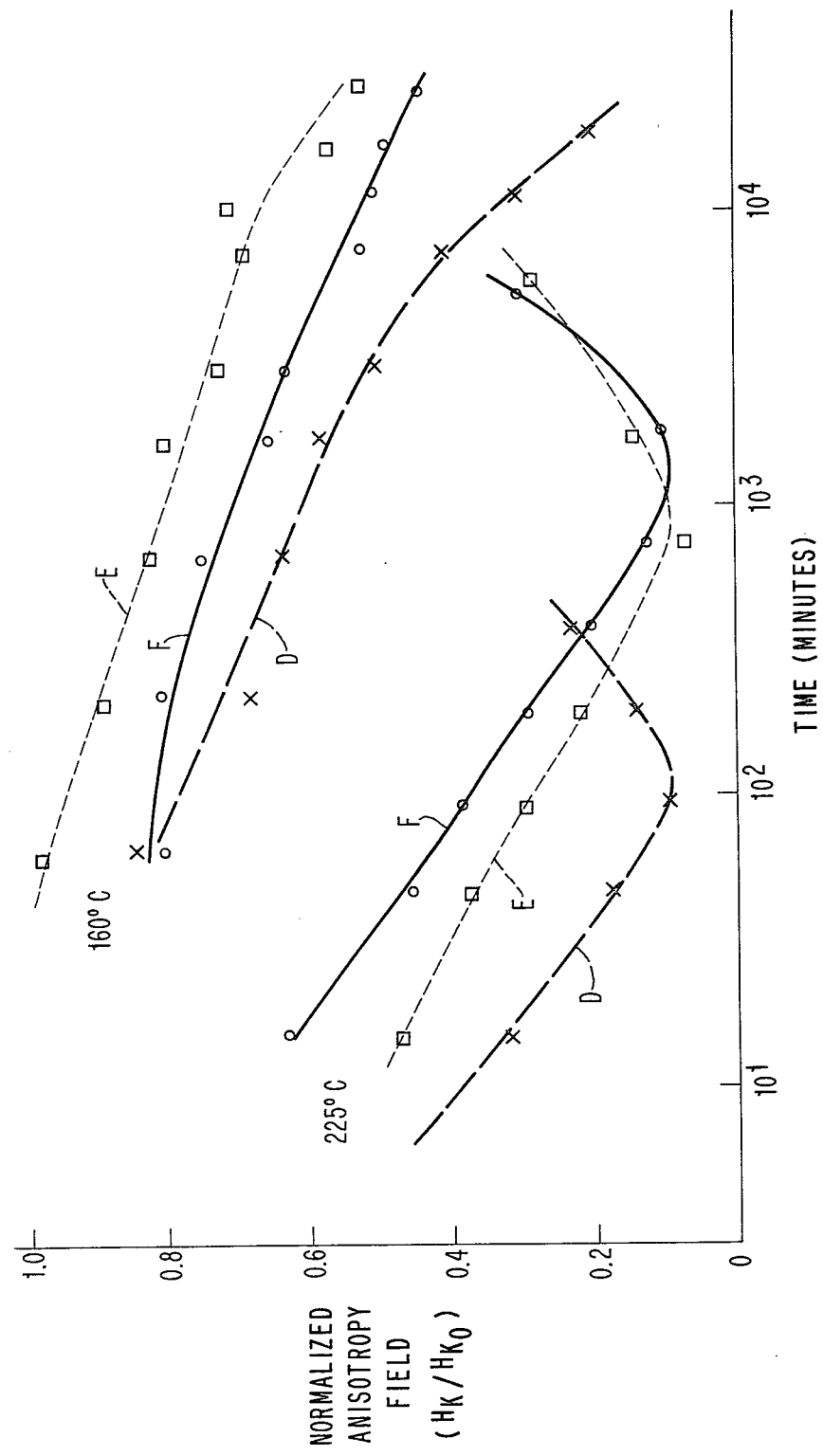
FIG. 6 shows a similar set of curves to FIG. 5.

FIG. 6 is a hard axis annealing vs. time curve similar to FIG. 5, but it shows the relative effects of performing the anneal in the D sample materials as contrasted with F sample materials of Co-Fe-B which had been stabilized by annealing the F materials for one hour at 300° C., (i.e., at a higher temperature). It will be seen that for the 160° C. temperature of hard axis annealing, curve F is even less steep in its decline relative to curve D than was curve F. Also for the 225° C. hard axis anneal the decline of curve F requires longer to reach its minimum, which would indicate that the higher 300° C. temperature provided superior stabilization for the material relative to $H_k$, although it raised $H_c$ quite significantly to about 0.62 Oe on the average, which is below the rule of thumb of 1.0 Oe.

Film Properties

Figure 7:
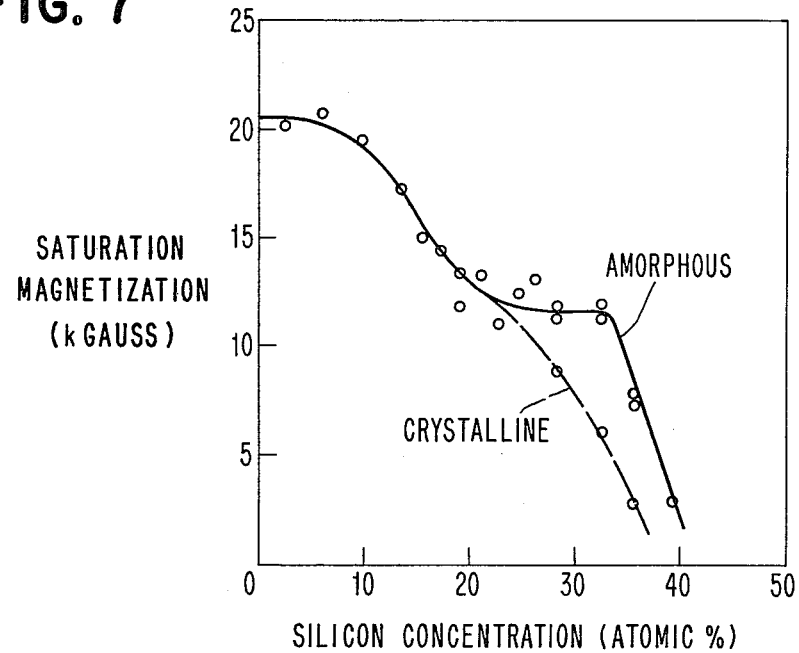
FIG. 7 shows a curve of saturation magnetization versus atomic percent silicon for a set of FeSi amorphous films.

X-ray diffraction experiments have shown that for the binary systems Fe-Si, Fe-B, Fe-Al, Co-B, Co-Si, and Ni-B, only Fe-Si Fe-B, and Co-B form amorphous films which are magnetic at room temperature for the sputtering conditions used. The formation of the amorphous phase in these three magnetic systems occurs respectively for metalloid content of Fe-Si, Fe-B, and Co-B over 26, 16, and 14 atomic percent, respectively; it extends to the highest concentration of metalloid studied, respectively 42 and 36 atomic percent for Fe-Si and Fe-B. Extensive data is presented below for the Fe-Si system. The room temperature saturation magnetization of Fe-Si films as a function of Si concentration as shown in FIG. 7 decreases with increase of silicon concentration and the films cease to be magnetic for a concentration of about 42 percent; between 21 and 32 atomic percent a plateau of constant magnetization occurs. X-ray diffraction measurements show that Fe-Si films are amorphous for silicon content of over 26 atomic percent. Upon crystallization, the magnetization of these films decreases as is shown by the dashed line in FIG. 7. The decrease in magnetization upon crystallization of amorphous films has been shown previously by Shimada et al, supra and A. W. Simpson and D. R. Branley, *Phys. Stat. Sol.*, B43, 291 (1971). We see from FIG. 8 that the magnetization continuously decreases as a function of the metalloid concentration.

Figure 8:
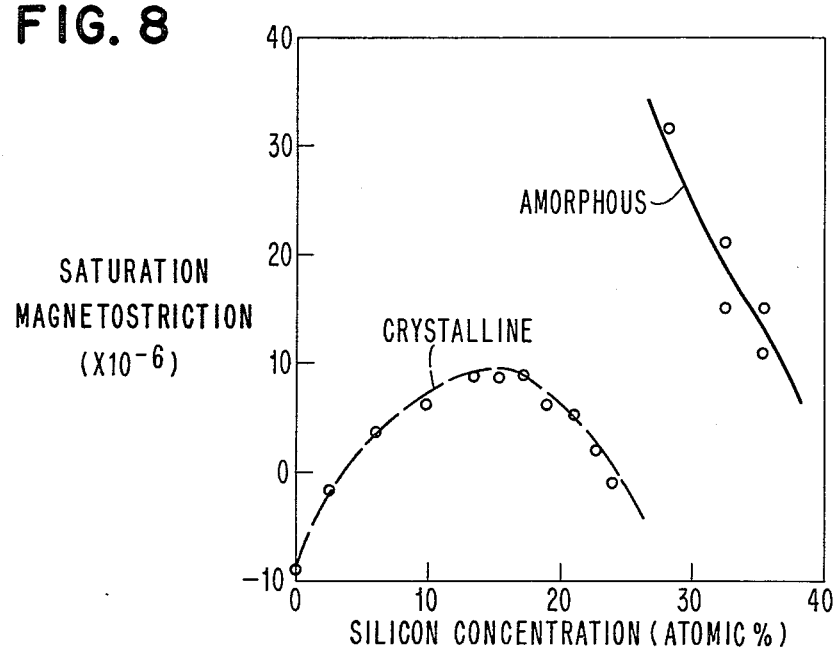
FIG. 8 shows a curve of saturation magnetostriction versus atomic percent of silicon for a set of FeSi amorphous films.

The magnetostriction of Fe-Si alloys as a function of silicon concentration shown in FIG. 8 shows closer correlation to the atomic structure as determined by X-ray diffraction results. The magnetostriction shows a discontinuous increase at 26 atomic percent to a high positive value, and then it decreases thereafter with increasing silicon content. Upon crystallization, the magnetostriction of amorphous Fe-Si films decreases. Values near zero were obtained after annealing between 180° and 225° C. Except for the low concentration silicon alloys, the magnetostriction of the crystalline alloys does not correspond in magnitude or sign to the values quoted by Shimada et al, supra for bulk alloys. This might be due to the fact that the sputtered crystalline films show a strong (110) preferred orientation, (N. Ainslie, F. M. d'Heurle, M. Entner, and E. Klokholm, *Proc.* 7th Inter. Vac., Cong., Vienna, (1977).

Figure 9A:
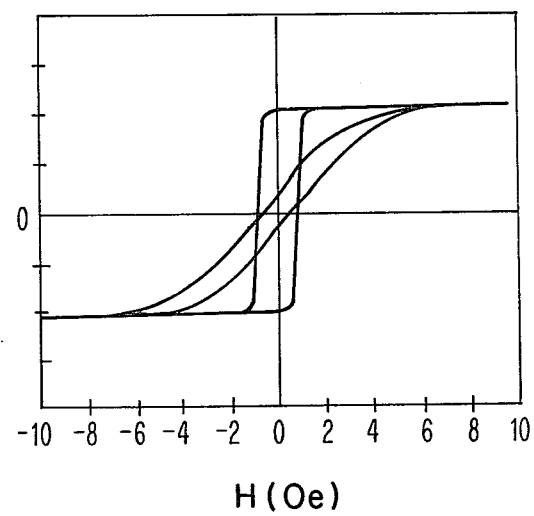
FIGS. 9A and 9B show a set of hysteresis curves for FeSi films before and after annealing to bring a perpendicular anisotropy field $H_K^*$ down into the plane of the film as $H_K$.
Figure 9B:
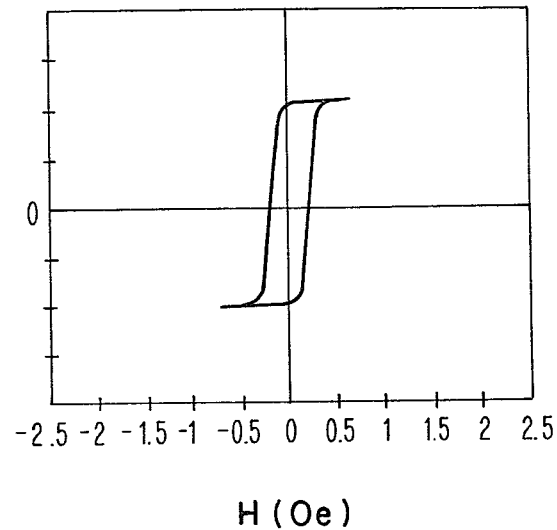

The B-H loop of the as-deposited amorphous films show perpendicular anisotropy shown in FIG. 9A. This could be the result of high stress and high magnetostriction (E. Klokholm and J. F. Freedman, *Jour. App. Phys.*, 38, 3, 1354, (1967)). After annealing, these films show an in-plane anisotropy in FIG. 9B. Note that the horizontal axis in FIG. 9A has a ratio of 2 Oe. versus 500 m Oersted for FIG. 9B, so the curve of FIG. 9B would be virtually a straight line next to the vertical axis if it were drawn to the scale of FIG. 9A. We have annealed amorphous films for half an hour, successively increasing the temperature in 25° C. increments from 150° C. to 300° C. For $Fe_{72}Si_{28}$, the films show an in-plane anisotropy after the 225° C. annealing, and the respective values of coercivity and anisotropy field are 0.2 and 4.2 Oe, FIG. 9B. Upon increasing the temperature, the coercivity increases and the films become magnetically isotropic with high coercivities. The same behavior occurs for amorphous Fe-Si films with higher silicon content. In-plane anisotropy and a low coercivity are obtained after annealing but a lower temperature is employed. The crystallization of these amorphous Fe-Si films occurs between 180° and 250° C.

The techniques and some of the equipment employed in accordance with this invention and described below are identical to those used for R. F. sputtering of materials such as amorphous Gd-Co-Mo films and have been reported elsewhere. C. H. Bajorek and R. J. Kobliska, *IBM J. Res. Develop.*, 20, 271 (1976); J. J. Cuomo and R. J. Gambino, *J. Vac. Sci. Technol.*, 79, (1975); and U.S. patent application Ser. No. 844,541, filed Oct. 26, 1977. Sputtering targets were fabricated by two different techniques: (a) known quantities of powders of transition metal were mixed with B and/or Si and arc-melted on a molybdenum backing plate in a helium atmosphere; (b) a pure transition metal or alloy target was covered by triangular segments of the desired metalloid. In the latter case, the substrate holder was rotated, insuring circumferential uniformity of the composition of the sputtered film. Typical sputtering conditions for the formation of these amorphous films are as follows: argon pressure of 20 microns; cathode bias voltage of 1000 volts; anode bias of −50 volts; and a water-cooled anode. Under these conditions, the deposition rate is of the order of 50 A per minute.

R. F. Sputtering System

Vacuum chamber 36 contains a sputtering cathode target 10 which sputters to provide an accumulation on a substrate 12 placed on an anode substrate holder 16. In our experiments, each substrate 12 is located on the anode 16 which is held at a low negative bias voltage $V_s$ with respect to the chamber wall 36 (ground) about −50 V, such that positive ion bombardment of the substrates is insignificant. The target voltage $V_t$ is measured with respect to the walls 36 of the sputtering chamber (ground). The sputtering experiments were carried out in an R. F. diode system shown in FIG. 10 which has been described in J. J. Cuomo and R. J. Gambino, *J. Vac. Sci. Tech.*, 12, 79 (1975).

Figure 10:
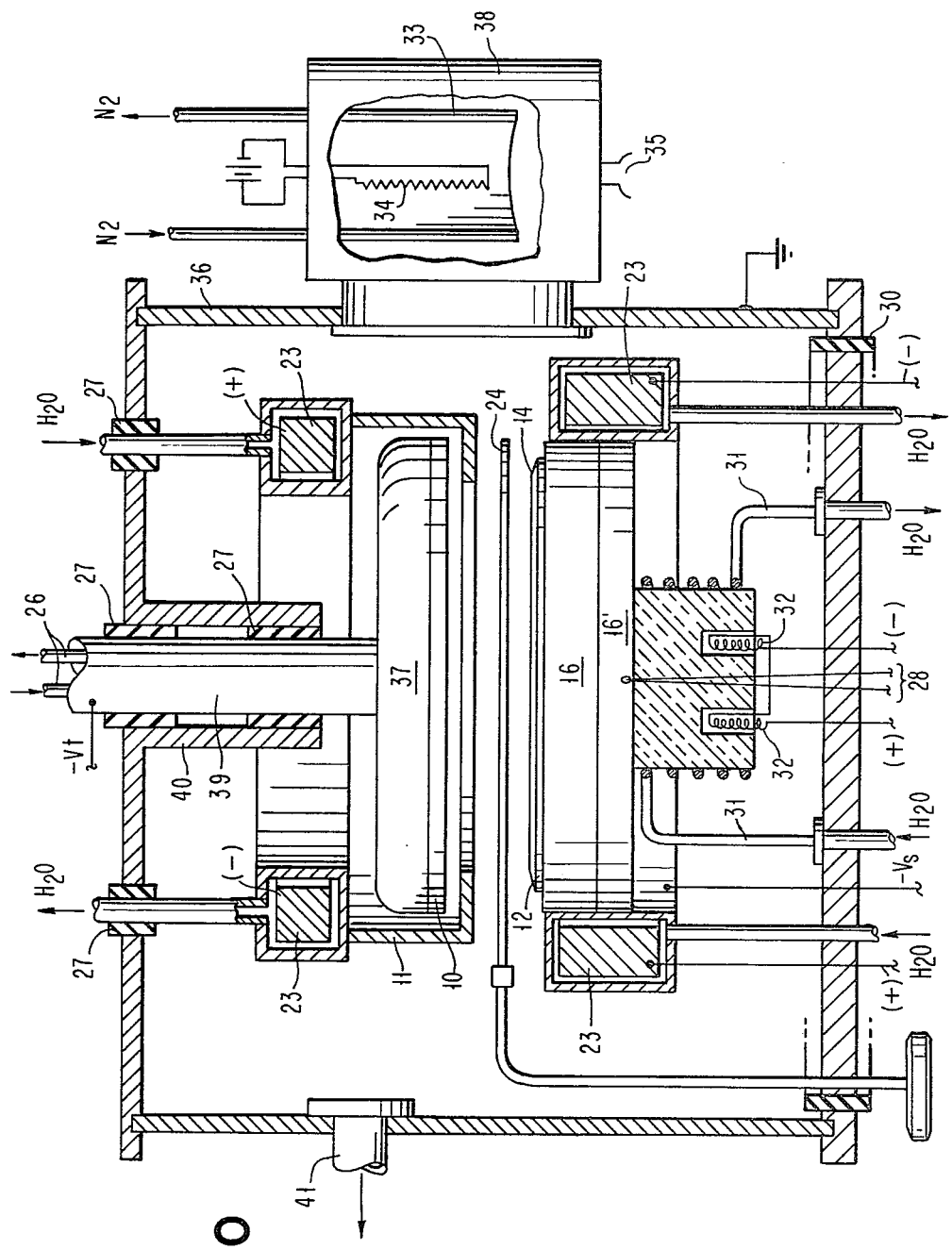
FIG. 10 shows a schematic diagram of a sputtering system used in making films employed in connection with this invention.

The sputtering system in FIG. 10 has a diode geometry and it is adapted for R. F. or D. C. sputtering. It includes a water-cooled cathode target 10 with water cooling tubes 26 connected to the cathode 37 for that purpose. A cathode ground shield 11 is provided which defines the pattern of deposition and etching provided with this invention. A shutter 24 between the target 10 and the anode 16 and substrate 12 allows presputtering of the target 10 prior to deposition and sputter-cleaning of the substrate 12. Water cooled electromagnets 23 are built into the system, although they are not essential to this invention. The target 10 and anode 16 are built into a stainless steel chamber 36 which is pumped by a Freon* fluorinated hydrocarbon coolant baffled 15 cm. diffusion pump (not shown). A titanium sublimation pump 34 with a liquid nitrogen cooled stainless steel shroud 33 is attached, in area 38 through a portal, to the system, where the sputter gas is admitted through port 35. Another pump 34 (not shown) is attached to the sputtering chamber 36. The chamber is typically prepumped to $5 \times 10^{-8}$ Torr using the two sublimation pumps 34 in combination with the 15 cm. diffusion pump which is connected to portal 41. The chamber 36 is partially isolated from the diffusion pump by a non-sealing valve (not shown) between portal 41 and the 15 cm. pump producing a pressure differential when 99.995 argon is introduced into the system. The sputter gas is introduced through chamber Ti/Cryo pump area 38 providing further purification. The argon pressure is controlled using capacitance manometer sensing and controlling an automatic valve.

*Trademark of E. I. duPont de Nemours

With the shutter 24 covering a substrate 12, the target 10 is presputtered for about one-half to one hour to clean the target surface and help getter the system of background impurities. The substrates are exposed to the flux of atoms from the target after the predetermined conditions for the substrates are set for the run. Generally, the substrates are water cooled and gallium backed and depositions from 0.5 to 2 hours produced thicknesses of about 0.5 to 2.0 μm, respectively.

Cathode isolation insulators 27 are provided between the cathode shaft 39 and housing 40 which supports it by attachment to chamber 36. A substrate thermocouple 28 is located below in the anode substrate holder support 16' to measure the approximate substrate temperature. An annular anode isolation insulator 30 is provided to insulate the substrate 12, anode 16, etc. from the walls of chamber 36. Substrate cooling coils 31 are wrapped about the base of support 16', which houses D.C. heating elements 32. A source of R.F. or D.C. power (not shown) is provided as is well known by those skilled in the art.

Targets were prepared by arc melting followed by melting into a shallow Mo dish serving as a backing plate also. Substrates were held on a water-cooled anode with thermally conducting compound. Target voltages $V_t$ of −500 V to −2500 V were used with an anode voltage (substrate bias) of −50 V. Substrates of thermal oxidized Si, Si, and glass were used. Most of the experiments were carried out using a fixed target voltage ($V_t = -1000$ Volts), bias voltage ($V_s = -50$ Volts), working gas composition (argon) and pressure (P=20 mTorr) in order to study the accumulation rate from various target compositions.

Sputtering of Fe-Si Alloys and Other Alloys With Rotatable Substrate Holder

Metal and alloy films have also been deposited by R.F. bias sputtering using a system similar to that described by R. J. Kobliska, R. Ruf, and J. J. Cuomo, *AIP Proc. Magnetism and Magnetic Materials*, San Franciso (1974). Such equipment was basically very similar to that shown in FIG. 10, but the substrate was rotatable as is well known in the art. In particular, the water-cooled 15 cm. cathode target is made of copper plate on which a 70 μm thick plate of pure (Materials Research Corporation Marz grade) iron (cobalt or nickel) has been mounted. A series of springs was attached on the periphery of the plate. Then 30° pieshaped segments of metal foils, boron or silicon plates, which were 16–40 mils thick, were positioned on the iron plate. The base of these triangular segments were held by the springs on the outer circumference of the plate and their apex was held under the wide head of a screw mounted in the center. This screw is made of the same metal as the plate. The metal segments were cut from pure metal foils, the silicon from 7.62 cm. diameter single crystal silicon wafers and the boron sliced out of large boron chunks. The latter were 99% pure and were obtained commercially. The anode assembly was water cooled and rotatable. Metal alloy films were sputtered on 2.54 cm. diameter, thermally oxidized, silicon wafers or on glass substrates. The rotating substrate holder assures the circumferential composition uniformity of the deposited film.

Characterization of Films

The chemical composition of alloy films, typically 3000 Angstroms thick, was measured by electron microprobe. The magnetic properties were measured using an inductive loop tracer with displayed the B vs. H curve directly on an oscilloscope. The saturation magnetization at room temperature was measured at high fields from the BH loop. The instrument was calibrated by measuring the saturation magnetization of several samples using a force balance magnetometer. The coercivity $H_c$ was obtained from the easy axis hysteresis loop: the anisotropy field $H_k$, by extrapolating the hard axis loop at small drive fields to the saturation magnetization value.

Resistivity measurements were made at room temperature using a four-point probe. Magnetostriction measurements were made at room temperature using the apparatus developed by Klokholm, supra.

The results reported above for Fe-Si are for depositions made at −50 Volts bias and 1000 Volts cathode potential. Most of the films were deposited using a water-cooled anode. Not all films adhere to the substrate; the high metalloid crystalline films cracked upon handling and some amorphous films lost adhesion upon annealing. The stress in these sputtered films is very high and compressive with values in the range of $1 \times 10^{10}$ dynes/cm$^2$. It was possible to deposit films of these compositions either by reducing the thickness or by not cooling the anode. In the last case, the temperature of the substrate would typically reach a maximum of 150° C.

The uniformity of the chemical composition of the deposited film was constant within the precision of the electron microprobe analysis. Multi-element thin films have been sputtered reproducibly using segments of different metals and glass formers.

Figure 11:
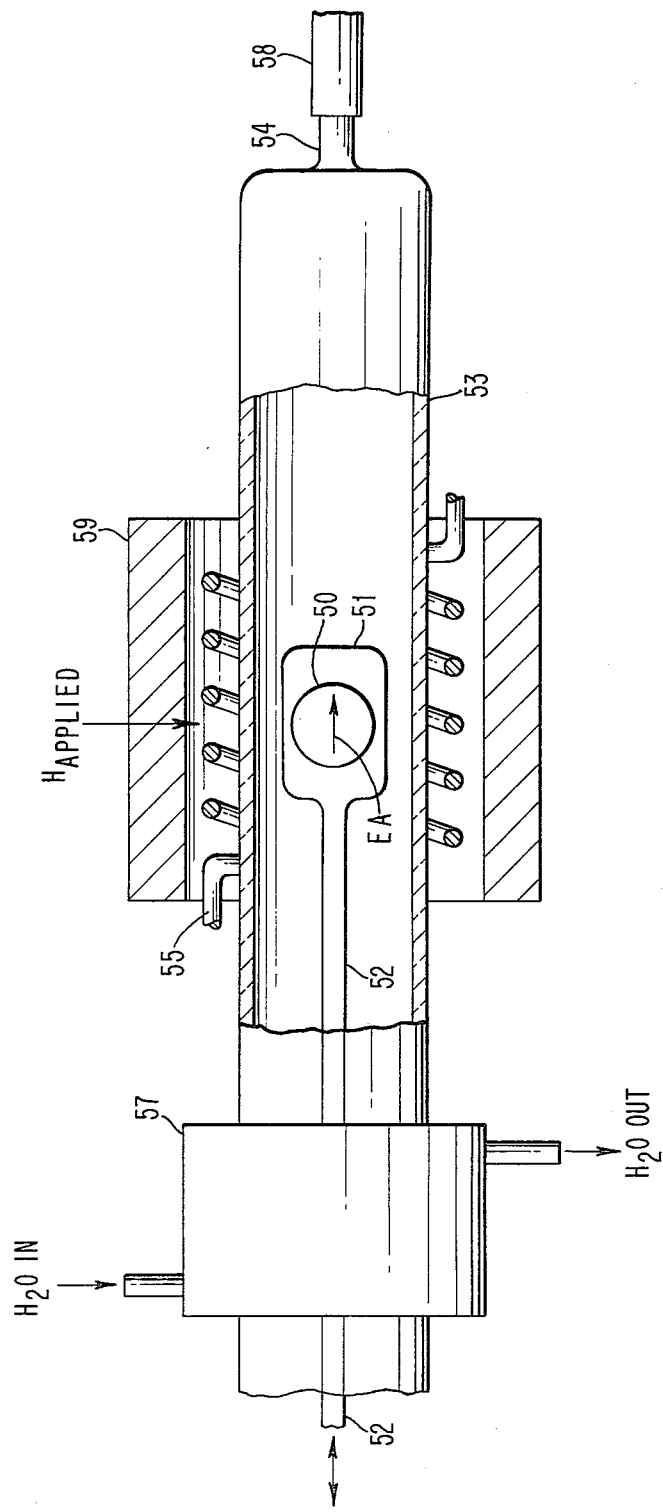
FIG. 11 shows an annealing apparatus for use in accordance with this invention.

FIG. 11 is a schematic drawing of annealing apparatus employed in accordance with this invention. A sample 50 is supported by a spatula 51, supported by an elongated cylindrical handle 52. The sample 50, spatula 51 and handle 52 are all enclosed within an elongated, cylindrical, sealed chamber 53 having a connection port 54 or the like at one end for exhausting gas from the system to provide a vacuum on the order of $10^{-7}$ or $10^{-8}$ Torr. An external source of a magnetic field H applied from magnet 59 is capable of providing a magnetic field at right angles to the easy axis of sample 50. A field-free helical coil 55 of heating wires is doubly wound on sample 50 providing annealing heat. A thermocouple temperature sensor (not shown) is included to provide control of temperature by adjusting the current level through coil 55. A cooling zone is provided by cooling coils in jacket 57 filled with cool water, which permits rapid cooling of the annealed material at the end of the desired annealing period to avoid speculation as to how long the annealing period may have been. Alternatively, the chamber 53 may not be evacuated, but may be filled with an inert gas such as argon, or helium preferably or even nitrogen (which may too reactive and may form different amorphous thin films as explained in copending U.S. patent application Ser. No. 866,115 of Cuomo, Gangulee, and Kobliska for "Amorphous Metallic and Nitrogen Containing Alloy Films Sputtered in Nitrogen Gas Atmosphere" filed Dec. 30, 1977, including $(Co_{78}Fe_5B_{17})_xN_{100-x}$ and $(Fe_{80}B_{20})_xN_{1-x}$ alloys). The inert gas is circulated from the tube through the system to an outlet, not shown, well before introducing the wafer into the heated zone until the oxygen, nitrogen and other reactive gases have been substantially removed from the chamber so that the wafer will be annealed in a substantially completely inert atmosphere. A manual timer was employed by the operator, commencing time measurement as the wafer 50 was inserted within the coil 55 and ending as it was removed.

Figure 12:
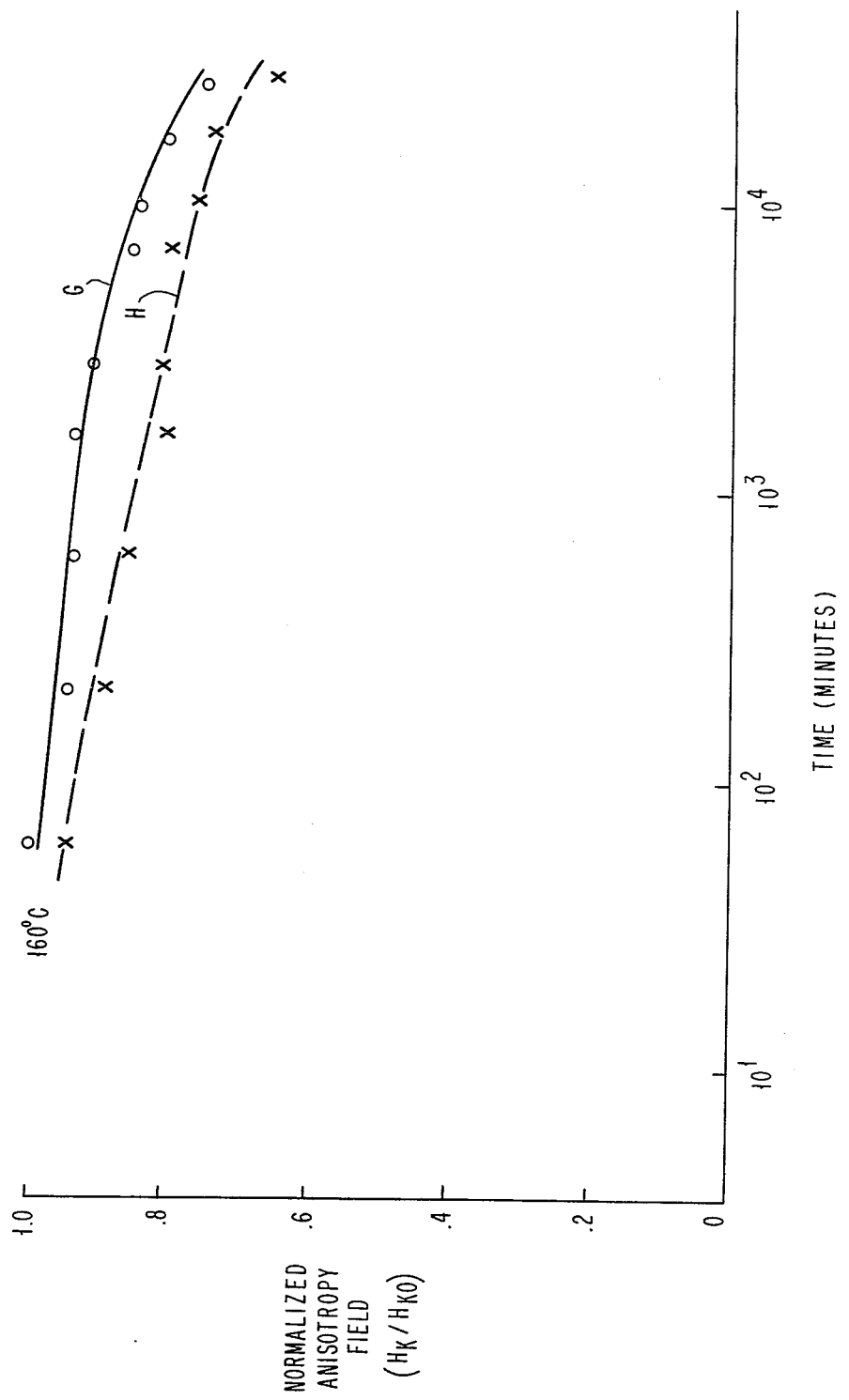
FIG. 12 shows normalized anisotropy curves versus annealing times as in FIG. 5 for a different alloy.

FIG. 12 shows a curve of the normalized anisotropy field for an iron-boron alloy $Fe_{73.2}B_{26.8}$ as a function of annealing time at 160° C. for two substantially identical samples G and H, which received different pre-annealing treatments. Sample G was annealed for sixteen hours at 250° C. and sample B was annealed for one hour at 325° C. Clearly, the anisotropy of sample G remains higher under the stress imposed by such annealing.

TABLE VI

| | Annealing Temperatures (Consecutive Annealing for 30 Minutes at Each Temperature) | | | | | | | | | |
|---|---|---|---|---|---|---|---|---|---|---|
| | 250° C. | | 300° C. | | 350° C. | | 400° C. | | 450° C. | |
| Alloy | $H_c$ | $H_k$ | $H_c$ | $H_k$ | $H_c$ | $H_k$ | $H_c$ | $H_k$ | $H_c$ | $H_k$ |
| 1. $Fe_{90}B_{10}$ | perpendicular | | perp. | | 40 | 200 | isotropic | | iso. | |
| 2. $Fe_{85}B_{15}$ | perp. | | perp. | | 20 | 90 | iso. | | iso. | |
| 3. $Fe_{83}B_{17}$ | .3 | 4.4 | .5 | 2.8 | .2 | 15 | iso. | | iso. | |
| 4. $Fe_{79}B_{21}$ | .12 | 6.8 | .14 | 6 | .15 | 4.2 | .5 | 2.6 | iso. | |
| 5. $Fe_{77}B_{23}$ | .16 | 6.6 | .19 | 6 | .2 | 5 | .25 | 3 | iso. | |
| 6. $Fe_{74}B_{26}$ | .2 | 7.6 | .19 | 6.8 | .21 | 5.8 | .25 | 4.3 | iso. | |
| 7. $Fe_{68}B_{32}$ | .16 | 7 | .16 | 6 | .19 | 4.2 | .21 | 3.8 | iso. | |
| 8. $Fe_{63}B_{37}$ | .12 | 4.3 | .15 | 4.2 | .15 | 4 | .19 | 3 | .24 | 2.2 |

Table VI shows annealing temperatures applied to a number of iron-boron alloys and the corresponding values of coercivity and anisotropy fields produced. Alloy 1 had an anisotropy field perpendicular to the plane until the 350° C. anneal. At higher temperatures the film was driven into the crystalline state. It can be seen that as the percentage of boron is increased for alloys 3 to 8 at 250° C. anneal, the values of $H_c$ and $H_k$ increase to alloy 6 and then decrease above about 25% boron. At 350° C. alloys 1 and 2 drop from large values of $H_c$ and $H_k$ as boron concentration is decreased to 17% and then peak about 26%, falling off at 37%. At higher temperatures of 400° C. and 450° C., lower concentrations of 13% tend to become isotropic more easily or with less heat as the crystallization temperatures apparently are lower for lower percentages of boron in the alloy. Alloy 8 with the highest percentage of boron is not isotropic even at 450° C. and furthermore the coercivity is not high. Alloys 6 and 7 with between 25% and 33% boron gave the highest values of $H_k$ at a 250° C. annealing temperature.

TABLE VII

Annealing Temperatures
(Consecutive Annealing for 30 Minutes at Each Temperature)

| Alloy | 175° C. $H_c$ Oe | 175° C. $H_k$ Oe | 200° C. $H_c$ Oe | 200° C. $H_k$ Oe | 225° C. $H_c$ Oe | 225° C. $H_k$ Oe | 250° C. $H_c$ Oe | 250° C. $H_k$ Oe | 275° C. $H_c$ Oe | 275° C. $H_k$ Oe |
|---|---|---|---|---|---|---|---|---|---|---|
| 1. $Fe_{72}Si_{28}$ | P* | | P | | .2 | 5.2 | .3 | 4.8 | 2.5 | 15 |
| 2. $Fe_{67}Si_{33}$ | P | | .26 | 3.4 | .2 | 3.4 | I* | | I | |
| 3. $Fe_{64}Si_{36}$ | P | | 1.0 | 2.6 | I | | I | | I | |

*P - perpendicular
*I - isotropic

Table VII shows a similar set of annealing data for a number of iron-silicon alloys. The greater the iron content, the higher the temperature of annealing at which the alloy was stable. However, at 275° C., the coercivity of alloy 1 exceeded 1.0 Oe. and at 200° C. alloy 3 reached a coercivity of 1. This underscores the fact that Fe-Si amorphous alloys must be annealed at low temperatures for a long time.

TABLE VIII

| Alloy | $4\pi M_s$ Gauss | $\lambda_s$ $(10^{-6})$ | As Deposited $H_c$ | As Deposited $H_k$ | Annealed 1 hr. at 250° C. $H_c$ (Oe) | Annealed 1 hr. at 250° C. $H_k$ (Oe) |
|---|---|---|---|---|---|---|
| 1. $Fe_{73}B_{22}Si_5$ | 11260 11922 10957 | +26 | perpendicular anisotropy | | 0.19 | 6.4 |
| 2. $Fe_{67}B_{20}Si_{17}$ | 10500 9136 | +19 | perpendicular anisotropy | | 0.2 | 5.2 |
| 3. $Fe_{64}B_{19}Si_{17}$ | 8565 | +14.5 | | | | |
| 4. $Fe_{63}B_{18}Si_{19}$ | 7600 | | perpendicular anisotrophy | | 0.3 | 1.2 |

Table VIII shows data for Fe-B-Si with a fixed ratio of Fe to B with increasing Si leading to lower $\lambda_s$ and to higher values of $H_c$ and lower values of $H_k$ after annealing for 1 hour. It also shows that the perpendicular anisotropy was removed.

Arrhenius Relationship $t = A \exp(-\Delta H/KT)$
t = rate of change of state (sec.)
A = constant (varies system to system)
$\Delta H$ = Activation Energy (ev per atom)
k = Boltzmann's constant
T = Temperature in °K It is believed that the change from the unstable state to the stable state is a thermally activated process governed by the Arrhenius relationship defined by the above equation. The consequence of that is that the minimum annealing time required to reach the second amorphous state must increase exponentially as the annealing temperature is decreased, and vice versa.

Industrial Applicability

The amorphous magnetic metallic thin films appear to have advantageous corrosion and wear resistance properties and magnetic properties equal to or better than the best thin film materials known for magnetic thin film read-write heads for various memory storage devices, (such as discs, tapes, diskettes, etc.) plus use with magnetic bubbles and magnetoacoustic devices.

Films incorporating large amounts of Cr and the like appear to have qualities competitive with Permalloy 80:20-Ni:Fe alloy.

The magnetic characteristics are better than Permalloy alloy without Cr or with small amounts of chromium and are about the same with large amounts of Cr.

For practical application in industry, an $H_c$ of less than 1 Oe is required for products of the type listed above. Furthermore, the value of $H_k$ must be above 1 Oe for the same reasons. In read-write heads, the easy axis must be well defined, and for the values of $H_k$ below 1 Oe. because the material is nearly magnetically isotropic, and the permeability is low. Therefore efficiency and accuracy are lost. If the head is isotropic, it is useless for high frequency recording. Thus, $H_k$ must be greater than $H_c$ by a substantial amount, and ideally, up to about 5-15 Oe. in accordance with current product design criteria in the data processing industry as a whole.

Having thus described our invention, what we claim as new and desire to secure by Letters Patent is:

1. A sputtered thin film of noncrystalline amorphous magnetic material consisting of Fe, B and from zero to ten percent of a transition metal selected from the group consisting of Cr, Mo, V, Ti, Cu, Pd, Pt, Re, Ru, Ta, Zr, Hf, Rh, Y, and Al, said thin film having been annealed in an external magnetic field below the Curie Temperature and the crystallization temperature to stabilize the magnetic easy axis, said thin film possessing a low $H_c$ of about one Qersted and below for domains with magnetization in the plane, having a well defined easy axis in that the value of $H_k$ exceeds the value of $H_c$, and said stabilized magnetic easy axis remaining unchanged in direction in the absence of heating above the Curie point with a high permeability of above 1000 from DC to high frequencies on the order of 1000 megahertz.

2. A film in accordance with claim 1 wherein said amorphous film includes at least about 16 atomic percent of B.

3. A film in accordance with claim 2 wherein said amorphous film includes a binary alloy of Fe and B having an anisotropy field $H_k$ greater than about 3 Oersteds with its direction in the plane of the film and a coercive field $H_c$ substantially less than about 0.5 Oersted.

4. A film in accordance with claim 3 wherein said anisotropy field is above about 1 Oe. and said coercive field is small and less than about 1 Oe.

5. A film in accordance with claim 2 wherein said film comprises an alloy of Fe and B of substantially 17 atomic percent B and the maximum annealing temperature is on the order of 350° C. and less than 400° C. for consecutive annealing at increasing temperatures.

6. A film in accordance with claim 2 wherein said film comprises an alloy of Fe and B of substantially 21-32 atomic percent B and the annealing temperature is a maximum of about 400° C. and less than 450° C. for consecutive annealing at increasing temperatures.

7. A film in accordance with claim 2 wherein said film comprises an alloy of Fe and B in the range of 37 atomic percent B and the maximum annealing temperature is about 450° C. for consecutive annealing at increasing temperatures.

8. A sputtered thin film of noncrystalline amorphous magnetic material consisting of Fe, with between about 26 and 42 atomic percent Si, and from zero to ten percent of a transition metal selected from the group consisting of Cr, Mo, V, Ti, Cu, Pd, Pt, Re, Ru, Ta, Zr, Hf, Rh,, Y, and Al, said thin film having been annealed in an external magnetic field below the Curie Temperature and the crystallization temperature to stabilize the magnetic easy axis, said thin film possessing a low $H_c$ of about one Oersted and below for domains with magnetization in the plane, having a well defined easy axis in that the value of $H_k$ exceeds the value of $H_c$ and said stabilized magnetic easy axis remaining unchanged in direction in the absence of heating above the Curie point with a high permeability of above 1000 from DC to high frequencies on the order of 100 megahertz.

9. A film in accordance with claim 8 wherein said amorphous film includes a binary alloy of Fe and Si having an anisotropy field $H_k$ greater than about one Oersteds with its direction in the plane of the film and a coercive field $H_c$ less than about one Oersted.

10. A film in accordance with claim 9 wherein said anisotropy field is above about 2 Oe. and said coercive field is small and less than about 0.5 Oe.

11. A film in accordance with claim 10 wherein said film comprises on the order of 28 atomic percent Si annealed for a relatively short time for a temperature in the range from 225° C. to 275° C. provided by consecutive annealing in increments with $H_c$ less than or equal to about 0.2 Oe and $H_k$ greater than or equal to about 4 Oe.

12. A film in accordance with claim 10 wherein said film comprises on the order of 33 atomic percent of Si annealed for about one hour at a temperature in the range of 200°–225° C., and the equivalent time and temperature in accordance with the Arrhenius relationship.

13. A film in accordance with claim 10 wherein said film comprises on the order of 36 atomic percent of Si annealed for about one-half hour at about 200° C. and the equivalent time and temperature in accordance with the Arrhenius relationship.

14. A sputtered thin film of noncrystalline amorphous magnetic material consisting of Co, B and from zero to ten percent of a transition metal selected from the group consisting of Cr, Mo, V, Ti, Cu, Pd, Pt, Re, Ru, Ta, Zr, Hf, Rh, Y, and Al, said thin film having been annealed in an external magnetic field below the Curie Temperature and the crystallization temperature to stabilize the magnetic easy axis, said thin film possessing a low $H_c$ of about one Oersted and below for domains with magnetization in the plane, having a well defined easy axis in that the value of $H_k$ exceeds the value of $H_c$ and said stabilized magnetic easy axis remaining unchanged in direction in the absence of heating above the Curie point with a high permeability of above 1000 from DC to high frequencies on the order of 100 megahertz.

15. A film in accordance with claim 14 wherein said amorphous film includes at least about 14 atomic percent of B.

16. A film in accordance with claim 15 wherein said amorphous film comprises an alloy of Co-Fe and B comprising substantially all of the constituents of the alloy having an anisotropy field $H_k$ with its direction in the plane of the film greater than 2 Oersteds and a coercive field $H_c$ less than one Oersted.

17. A film in accordance with claim 16 wherein said anisotropy field is above about 10 Oe. and said coercive field is small and less than about 0.5 Oe.

18. A sputtered thin film of noncrystalline amorphous magnetic material consisting of Co, Fe, B and from zero to ten percent of a transition metal selected from the group consisting of Cr, Mo, V, Ti, Cu, Pd, Pt, Re, Ru, Ta, Zr, Hf, Rh, Y, and Al, said thin film having been annealed in an external magnetic field below the Curie Temperature and the crystallization temperature to stabilize the magnetic easy axis, said thin film possessing a low $H_c$ of about one Oersted and below for domains with magnetization in the plane, having a well defined easy axis in that the value of $H_k$ exceeds the value of $H_c$ and said stabilized magnetic easy axis remaining unchanged in direction in the absence of heating above the Curie point with a high permeability of above 1000 from DC to high frequencies on the order of 100 megahertz.

19. A film in accordance with claim 18 wherein said amorphous film includes at least about 74 atomic percent of Co, about 5% of Fe, and about 14% of B annealed from 1 hour at 325° C. and at temperatures and times comprising the equivalent in accordance with the Arrhenius relationship up to 16 hours at 250° C.

20. A film in accordance with claim 18 wherein said amorphous film includes a ternary alloy of Co-Fe and B having an anisotropy field $H_k$ above about 10 Oersteds with its direction in the plane of the film and a coercive field $H_c$ less then or equal to one Oersted.

21. A film in accordance with claim 20 wherein said anisotropy field is above about 1 Oe. and said coercive field is small and less than about 1 Oe.

22. A sputtered thin film of noncrystalline amorphous magnetic material consisting of Fe, Si, B and from zero to ten percent of a transition metal selected from the group consisting of Cr, Mo, V, Ti, Cu, Pd, Pt, Re, Ru, Ta, Zr, Hf, Rh, Y, and Al, said thin film having been annealed in an external magnetic field below the Curie Temperature and the crystallization temperature to stabilize the magnetic easy axis, said thin film possessing a low $H_c$ of about one Oersted and below for domains with magnetization in the plane, having a well defined easy axis in that the value of $H_k$ exceeds the value of $H_c$ and said stabilized magnetic easy axis remaining unchanged in direction in the absence of heating above the Curie point with a high permeability of above 1000 from DC to high frequencies on the order of 100 megahertz.

23. A film in accordance with claim 22 wherein said amorphous film includes at least about 5 to 17 atomic percent of Si and a ratio of about 3 Fe atoms per atom of B.

24. A film in accordance with claim 22 wherein said amorphous film includes a ternary alloy of Fe, Si and B having an anisotropy field $H_k$ with its direction in the plane of the film greater than 1 Oersted and a coercive field $H_c$ less than 1 Oersted.

25. A film in accordance with claim 24 wherein said anisotropy field is above about 5 Oe. and said coercive field is small and less than about 0.3 Oe.

26. A film in accordance with claim 18 wherein said film includes a small percentage of Mo.

27. A film in accordance with claim 1 wherein said film includes a small percentage of Cr.

28. A film in accordance with claim 20 wherein said film has been annealed at about 250° C. for several hours up to on the order of 15 hours and more to produce a relative permeability above 4,000.

29. A film in accordance with claim 28 wherein said annealing time and temperature are varied in accordance with the Arrhenius relationship.

30. A method of making amorphous magnetic thin films with a highly stable easy axis comprising depositing upon a surface of an object a thin film of an amorphous alloy consisting essentially of the composition represented by X Y where X is at least one element selected from the group consisting of Fe, Co and Ni and Y is at least one element selected from the group consisting of Si and B, and then annealing said thin film in an atmosphere of an inert gas and in an external magnetic field at a temperature below the Curie temperature and below the crystallization temperature for said alloy to stabilize the magnetic easy axis of said film for a period of time in excess of one hour sufficient to provide substantially increased stabilization of the magnetic anisotropy direction in the plane of the film.

31. A method of making amorphous magnetic thin films with a highly stable easy axis comprising depositing a thin film of an amorphous alloy consisting essentially of Fe and substantially 17 atomic percent B and then annealing said thin film in an atmosphere of an inert gas and in an external magnetic field at a temperature below the Curie temperature and below the crystallization temperature for said alloy and the maximum annealing temperature is on the order of 350° C. and less than 400° C. for consecutive annealing to stabilize the magnetic easy axis of said film for a period of time in excess of one hour sufficient to provide substantially increased stabilization of the magnetic anisotropy direction in the plane of the film.

32. A method of making amorphous magnetic thin films with a highly stable easy axis comprising depositing a thin film of an amorphous alloy consisting essentially of Fe and substantially 21–32 atomic percent B and then annealing said thin film in an atmosphere of an inert gas and in an external magnetic field at a temperature below the Curie temperature and below the crystallization temperature for said alloy and the annealing temperature is a maximum of about 400° C. and less than 450° C. for consecutive annealing at increasing temperatures to stabilize the magnetic easy axis of said film for a period of time in excess of one hour sufficient to provide substantially increased stabilization of the magnetic anisotropy direction in the plane of the film.

33. A method of making amorphous magnetic thin films with a highly stable easy axis comprising depositing a thin film of an amorphous alloy consisting essentially of Fe and and in the range of 37 atomic percent B and then annealing said thin film in an atmosphere of an inert gas and in an external magnetic field at a temperature below the Curie temperature and below the crystallization temperature for said alloy where the maximum annealing temperature is about 450° C. for consecutive annealing at increasing temperatures to stabilize the magnetic easy axis of said film for a period of time in excess of one hour sufficient to provide substantially increased stabilization of the magnetic anisotropy direction in the plane of the film.

34. A method of making amorphous magnetic thin films with a highly stable easy axis comprising depositing a thin film of an amorphous alloy consisting essentially of Fe and on the order of 28 atomic percent Si annealed for a relatively short time and then annealing said thin film in an atmosphere of an inert gas and in an external magnetic field at a temperature in the range from 225° C. to 275° C. provided by consecutive annealing in increments below the Curie temperature and below the crystallization temperature for said alloy to stabilize the magnetic easy axis of said film for a period of time in excess of one hour sufficient to provide substantially increased stabilization of the magnetic anisotropy direction in the plane of the film.

35. A method of making amorphous magnetic thin films with a highly stable easy axis comprising depositing a thin film of an amorphous alloy consisting essentially of Fe and on the order of 33 atomic percent of Si said thin film annealed for about one hour in an atmosphere of an inert gas and in an external magnetic field at a temperature in the range of 200°–225° C. below the Curie temperature and below the crystallization temperature for said alloy to stabilize the magnetic easy axis of said film for a period of time in excess of one hour sufficient to provide substantially increased stabilization of the magnetic anisotropy direction in the plane of the film.

36. An amorphous magnetic thin film with a highly stable easy axis fabricated by sputtering a thin film of an amorphous alloy consisting essentially of Fe and on the order of 36 atomic percent of Si, said thin film annealed for about one-half hour at about 200° C. and the equivalent time and temperature in an atmosphere of an inert gas and in an external magnetic field at a temperature below the Curie temperature and below the crystallization temperature for said alloy to stabilize the magnetic easy axis of said film for a period of time in excess of one hour sufficient to provide substantially increased stabilization of the magnetic anisotropy direction in the plane of the film.

37. An amorphous magnetic thin film with a highly stable easy axis fabricated by sputtering a thin film of an amorphous alloy consisting essentially of at least about 74 atomic percent of Co, about 5% of Fe, and about 14% of B said thin film annealed from 1 hour at 250° C. and at temperatures and times comprising the equivalent in an atmosphere of an inert gas and in an external magnetic field below the Curie temperature and below the crystallization temperature for said alloy to stabilize the magnetic easy axis of said film for a period of time in excess of one hour sufficient to provide substantially increased stabilization of the magnetic anisotropy direction in the plane of the film.

38. An amorphous magnetic thin film with a highly stable easy axis fabricated by sputtering a thin film of an amorphous alloy consisting essentially of Fe, B, and at least about 5 to 17 atomic percent of Si with a ratio of about 3 Fe atoms per atom of B and then said thin film annealed in an atmosphere of an inert gas and in an external magnetic field at a temperature below the Curie temperature and below the crystallization temperature for said alloy to stabilize the magnetic easy axis of said film for a period of time in excess of one hour sufficient to provide substantially increased stabilization of the magnetic anisotropy direction in the plane of the film.

39. A method in accordance with claim 37 wherein said film includes a small percentage of Mo.

40. A method in accordance with claim 30 wherein said film includes a small percentage of Cr.

41. A method in accordance with claim 37 wherein said film has been annealed at about 250° C. for several hours up to on the order of 15 hours.

42. A method in accordance with claim 30 wherein said alloy includes up to ten percent of a transition metal selected from the group consisting of Cr, Mo, V, Ti, Cu, Pd, Pt, Re, Ru, Ta, Zr, Hf, Rh, Y, and Al.

43. A method in accordance with claim 30, 31, 32, 33, 34 or 35 wherein said depositing step is performed by sputtering in a vacuum chamber.

44. A method in accordance with claim 30, 31, 32, 33, 34 or 35 wherein said depositing step is performed by sputtering in a vacuum chamber, and said annealing is performed in an evacuated chamber.

45. A method in accordance with claim 30, 31, 32, 33, 34 or 35 wherein a step of pre-annealing stabilization is employed by heating a film in an external magnetic field for easy axis stabilization.

* * * * *